(12) United States Patent
Soebroto

(10) Patent No.: US 8,975,919 B1
(45) Date of Patent: Mar. 10, 2015

(54) DUAL ROW I/O WITH LOGIC EMBEDDED BETWEEN ROWS

(71) Applicant: Cadence Design Systems, Inc., San Jose, CA (US)

(72) Inventor: Tobing Soebroto, Cupertino, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 48 days.

(21) Appl. No.: 13/624,773

(22) Filed: Sep. 21, 2012

(51) Int. Cl.
*H01L 25/00* (2006.01)
*H03K 19/173* (2006.01)

(52) U.S. Cl.
USPC ............... 326/47; 326/38; 326/41; 326/101

(58) Field of Classification Search
USPC ............... 326/38, 41, 47, 101; 257/666, 676
See application file for complete search history.

(56) References Cited

U.S. PATENT DOCUMENTS

| 4,975,758 | A * | 12/1990 | Crafts | 257/203 |
| 6,721,933 | B2 * | 4/2004 | Iwasa | 257/203 |
| 2006/0234426 | A1 * | 10/2006 | Lau | 438/127 |
| 2010/0112761 | A1 * | 5/2010 | Tsutsumi et al. | 438/124 |

* cited by examiner

*Primary Examiner* — Daniel D Chang
(74) *Attorney, Agent, or Firm* — Sawyer Law Group, P.C.

(57) ABSTRACT

The present invention provides for a method and circuit of an integrated circuit (IC) having dual row input/output (I/O). The circuit having a plurality of dual I/Os including an upper row of I/O and a lower row of I/O, with logic arranged in communication between the upper and the lower rows of the dual row I/O. The connectivity with the logic circuits of the present invention therefore provides for improving reliability and performance through more similar and uniform pathway connections. Advantageously, the present invention also provides for the reallocation of valuable footprint space as the logic is embedded within the dual row I/O thereby creating additional footprint space for further performance and other beneficial gain where interconnects as between the physical layer (PHY) logic and I/O cells are generally similar in length.

9 Claims, 3 Drawing Sheets

DUAL ROW I/O WITH LOGIC EMBEDDED BETWEEN ROWS

FIELD OF THE INVENTION

The present invention relates generally to microprocessors, and more particularly, to methods and circuit arrangements for optimized integrated circuit (IC) design.

BACKGROUND OF THE INVENTION

Providing for greater packaging densities, additional functionality and optimized use of limited footprints in microprocessor, integrated circuit and memory design (collectively "chip design") is highly desired in the electronics and communications industries today. By integrating improved silicon-based chip works into popular devices such as cell phones and computers, the physical size of such devices can be reduced while the functionality of the devices may be increased, with improved performance and efficiency due to the improved chipsets.

Objectives for semiconductor package structures include continued attempts to find opportunities and designs for miniaturization, thereby improving the functional and physical density of components that are packaged in a semiconductor or integrated circuit (i.e., chip or IC). Often designers may seek to find optimized arrangement and placement of components and circuitry encouraging miniaturization while maintain reliability.

For instance, in the practice of reuse of existing maskwork designs, it is desirable to provide sufficient power to drive larger geometries on the processor board for new designs which would logically be provided by the I/O cells. Those I/O cells then would likely still be physically large in comparison to the physical characteristics of on-die logic and therefore would require additional costs for chips requiring a greater number of I/O cells, in part as their footprint may also require more size.

FIG. 1 sets forth a traditional chip layout 100 in which there is a physical footprint of the shape of the substrate platform 105 which includes space for circuits and electronics including core logic 110, physical layer (PHY) logic 120 and input/output (I/O) cells 130. Typically, connections from the core logic 110 to the PHY logic 120 are low speed connections 180 and connections from the PHY logic 120 to the I/O cells 130 are high speed connections 190.

From FIG. 1, connections from the core logic to the PHY logic may be generally symmetric in layout; whereafter connections from PHY logic to I/O cells are approximately similar. In such a design however, the I/O cells require a large footprint of valuable physical layout and similarly the connections between the core logic, PHY logic and I/O cells are also footprint intensive. It is desirable to have a better utilization of the available footprint and improve density usage for performance-based operations.

By example, to effect an implementation improving the density of a chip of a typical wireless handset while limiting the footprint requirement, the base-band processors, memory components and interface bus necessitate a dense level of I/O and wiring. Similarly, it may also be possible to further integrate the memory bus and other functions into the stack for the phone. Many cell phone manufacturers today seek to provide a package platform in which the memory components are stacked or dual onto the processor, often in an attempt to improve both the efficiency and density of limited processor footprint. Similarly, other device manufacturers, such as those involved with personal data assistants ("FDA's"), camcorders, entertainment equipment and devices, notebook computers, etc. (i.e., devices), seek similar objectives.

In practice, by folding or situating the I/O cell on top of one another, a dual row of IO cells may be created on the processor thereby reducing space concerns regarding the highly competitive space constraints of the platform while only minimally increasing the lesser-restrictive height aspects of the platform. FIG. 2 sets forth an example of a dual I/O cell arrangement on a chip 200 in which there is a physical footprint of the shape of the substrate of the platform 205, which includes space for circuits, electronics and core logic 210, PHY logic 220, and dual I/O cells 230. From the Figure, I/O cells are atop other I/O cells at 230 and are preferably edge-aligned. In this arrangement, the PHY logic 220 is typically of lesser dimension in width than the I/O cells. Also, in this arrangement, connections from the core logic 210 to the PHY logic 220 are low speed connections 280 and connections from the PHY logic 220 to the I/O cells 230 are high speed connections 290.

The approach set forth in FIG. 2 provides for a higher density device with a dual row and even quad row configurations being possible. From FIG. 2, while the I/O cells require a smaller footprint, the dimensional issue of the PHY logic (width for instance in comparison to the I/O cells) can become a restrictive factor in design. Comparative with FIG. 1, the chip arrangement of FIG. 2 provides for a more compact design.

However, though the dual row style chip may improve the physical footprint available for other electronic and circuit placement on the processor, the dual I/O cells of FIG. 2 also presents added complexities and limitations in implementation. Inconsistent connection distances between the logic and I/O become apparent and similarly as between the bus and the I/O. These inconsistencies yield potential issues of signal loss or delay as between communication flows from I/O or bus to logic over the inconsistent connection lengths. Unfortunately, the high speed connections as between the PHY logic and the I/O cells, are directly affected in performance where connection lengths are dissimilar. Accordingly, it is important for high speed connection that these connection lengths be as uniform as possible. Further, there remains an ever-increasing need for an approach which is economical and improves efficiencies over existing efforts.

What is desired is an approach that provides for a direct and consistent connection of the stacked I/O with the logic and bus connections of the processor to provide predetermined connection distances consistent with one another for improved performance, with improved economics and reliability and an optimized footprint layout.

As used herein the terms device, apparatus, system, etc. are intended to be inclusive, interchangeable, and/or synonymous with one another and other similar arrangements and equipment for purposes of the present invention though one will recognize that functionally each may have unique characteristics, functions and/or operations which may be specific to its individual capabilities and/or deployment.

SUMMARY OF THE INVENTION

The present invention fulfills these needs and has been developed in response to the present state of the art, and in particular, in response to the problems and needs in the art that have not yet been fully solved by currently available technologies.

In one aspect, the present invention provides for an integrated circuit having a substrate with circuitry including a bus, a plurality of electronic components including core logic arranged for communication with the circuitry; and a dual row I/. The dual row I/O includes a first plurality of I/O cells and a second plurality of I/O cells arranged in general alignment in relation to one another. Physical layer (PHY) logic is preferably arranged for communication with the dual row I/O and being situated between the first plurality of I/O cells and the second plurality of I/O cells. The plurality of communication interconnects arranged between each plurality of I/O cells and one or more of the PHY logic and the bus.

In one or more embodiments, the present invention further provides that the length of the interconnects between the PHY logic and the I/O cells of the IC are generally the same or similar to one another. In further embodiments, the present invention also provides that the length of the interconnects between the PHY logic and the bus are generally the same or similar to one another in length.

In a further aspect, the present invention provides for an integrated circuit comprising a substrate having circuitry including a bus, a plurality of electronic components and a dual row I/O comprising an upper plurality of I/O cells and a lower plurality of I/O cells arranged in general alignment in relation to one or more physical edges. In a preferred embodiment, the PHY logic is arranged for communication with the dual row I/O and being situated between the upper plurality of I/O cells and the lower plurality of I/O cells. Similarly, it is desired to also include interconnects having a plurality of communication pathways having a length being arranged between each plurality of I/O cells and one or more of an associated PHY logic for each I/O cell of each plurality of I/O cells.

In one or more additional preferred embodiments, the circuit further includes each of the bus pathways being approximately a same length as between the associated PHY logic and the bus, each of the bus pathways being substantially a similar length as between the associated PHY logic and the bus, or each of the bus pathways being generally a same length as between the associated PHY logic and the bus.

In a further aspect of the present invention, an integrated circuit is provided for where the circuit includes a substrate having circuitry including a bus, a plurality of electronic components including core logic arranged for communication with the circuitry through the interconnects, a dual row I/O comprising a first plurality of I/O cells and a second plurality of I/O cells arranged in general alignment in relation to one or more physical edges, PHY logic arranged for communication with the dual row I/O and being situated between the first plurality of I/O cells and the second plurality of I/O cells; and, interconnects including a plurality of PHY logic pathways having a length being arranged between each plurality of I/O cells and one or more of an associated PHY logic for each I/O cell of each plurality of I/O cells and a plurality of Bus pathways have a length being arranged between each plurality of PHY logic and an associated I/O cell of each plurality of I/O cells.

Further embodiments, forms, objects, features, advantages, aspects, and benefits of the present application shall become apparent from the detailed description and drawings included herein.

DETAILED DESCRIPTION

The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 1:
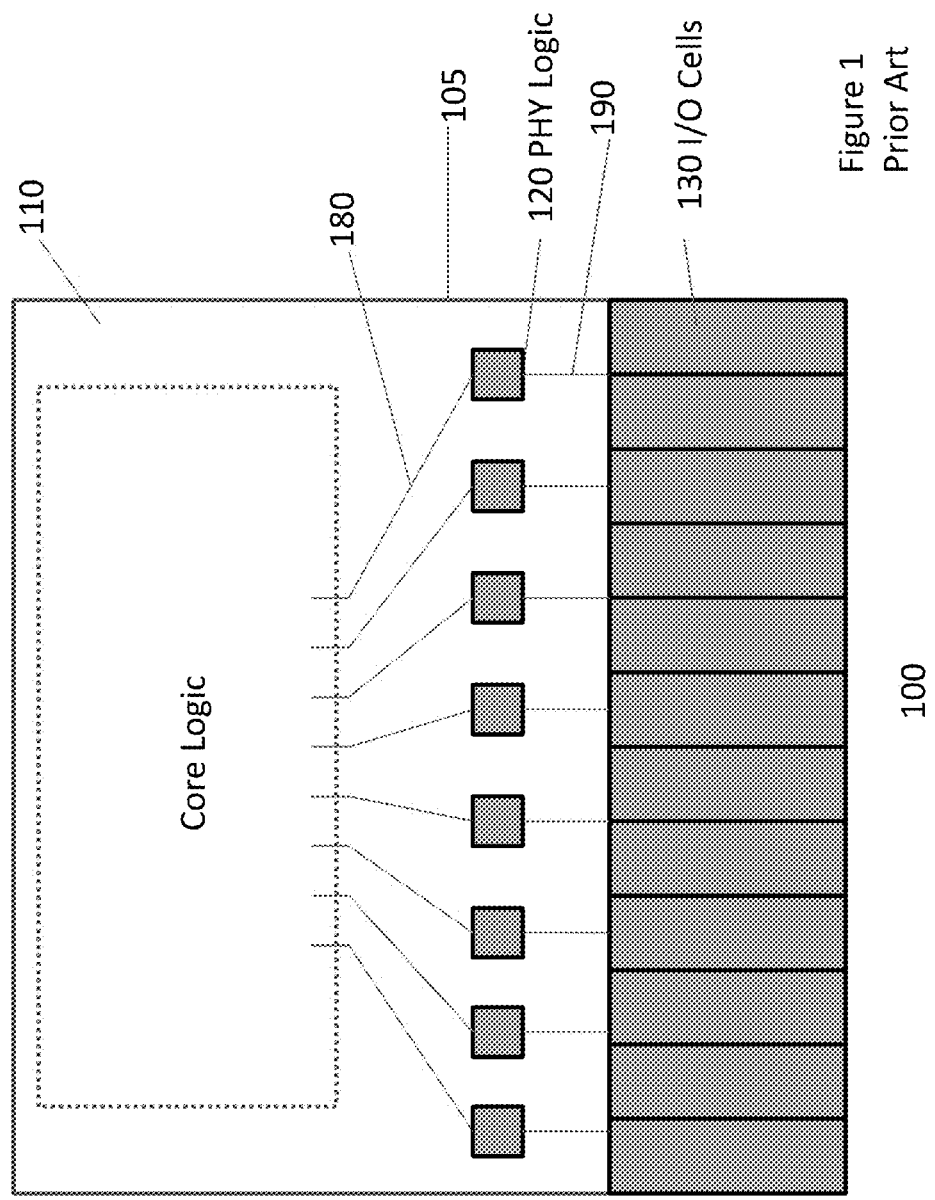
FIG. 1 sets forth a traditional chip layout in which there is a physical footprint of the shape of the substrate platform which includes space for circuits and electronics, logic and input/output (I/O) cells.
Figure 2:
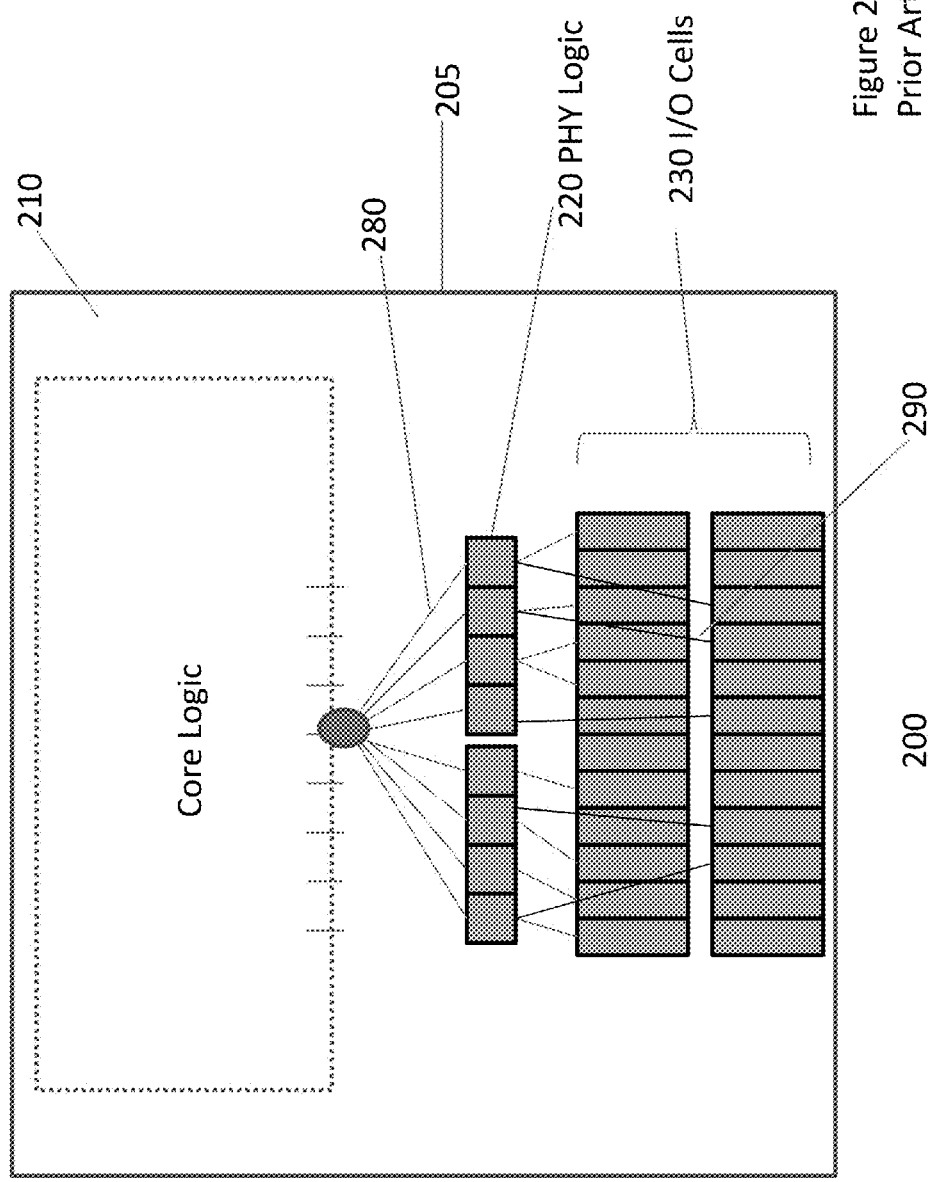
FIG. 2 sets forth an example of a dual I/O cell arrangement on a chip in which there is a physical footprint, of the shape of the substrate of the platform which includes space for circuits and electronics, logic, and dual I/O cells; and, FIG. 3 provides a cross-sectional view of the circuit in accordance with one or more embodiments of the present invention.
Figure 3:
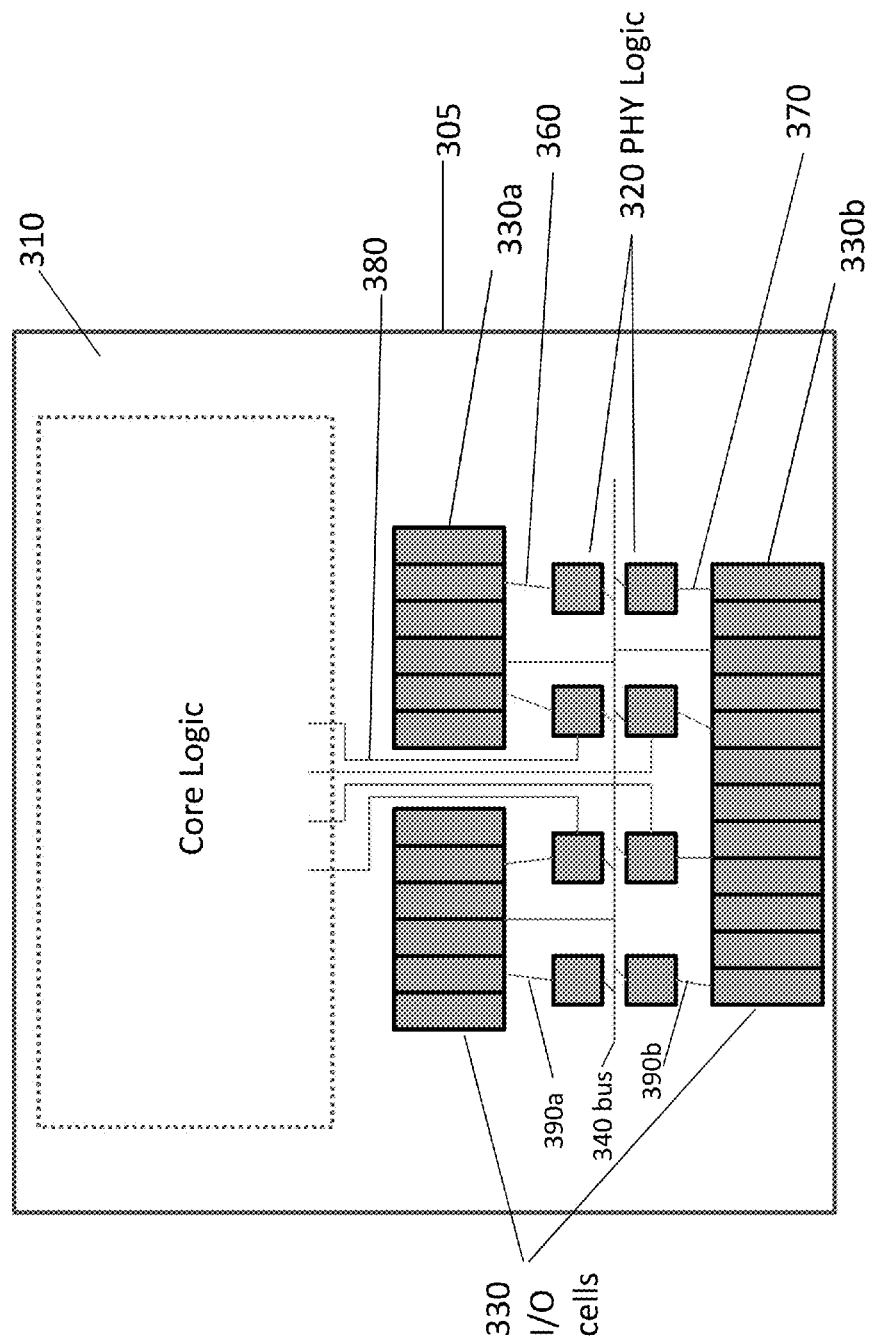

FIG. 3 provides a cross-sectional view of the circuit 300 in accordance with one or more embodiments of the present invention.

From FIG. 3, the circuit 300 includes a substrate having circuitry and core logic associated therewith at 310, a dual row I/O at 330 and PHY logic situated between each row of the dual row I/O at 320, communicating through the bus 340. In a preferred embodiment, the dual row I/O is stacked. It will be appreciated by those skilled in the art that a bus is also present in the arrangement, though not shown, as the bus may be situated in a variety of locations but is implicitly set forth as being part of the circuitry of the substrate for exemplary purposes herein.

In accordance with one embodiment of the present invention, from FIG. 3, the dual row I/O further includes a plurality of upper I/O cells at 330a and plurality of lower I/O cells at 330b. Interconnects, connective links, or internal communication circuits, wiring, or similar (collectively, interconnects) are provided at 360 for communication between the PHY logic and the first I/O cells, and similar at 370 for communication between the PHY logic and the second I/O cells. For clarity, connections as between the core logic 310 and the PHY logic 320 are low speed connections 380 and connections between the PHY logic 320 and the I/O cells are high speed connections, 390a, 390b. Of particular interest for the present invention is that high speed connections 390a and 390b are of generally similar lengths or are generally uniform in the footprint so as to improve reliability of performance overcoming limitations of the prior attempts. The connectivity with the logic circuits of the present invention therefore provides for improving reliability and performance through more similar and uniform pathway connections.

Additionally, though not shown to avoid complexity to the figure, the present invention in one or more embodiments also provides for communication between the bus and the upper I/O cells and at for communication between the bus and the upper I/O cells.

The present invention, in one or more embodiments, provides for direct connections as between the I/O cells and their PHY logic, where the interconnections (or connects) as between are each of a substantially similar length. In such an arrangement, the present invention also overcomes the limitations of the prior art of having approaches and/or PHY logic which is length restrictive for designers and layout considerations.

In a stacked I/O embodiment, in accordance with another embodiment of the present invention, the dual row I/O is stacked with the physical layer (PHY) logic in between. In such an embodiment, a plurality of upper I/O cells at 330a and plurality of lower I/O cells at 330b are situated so as to be connected through interconnects with the PHY Logic. Interconnects are provided at 360 for communication between the logic and the upper I/O cells, at 370 for communication between the logic and the lower I/O cells. Additionally, though not shown to avoid complexity to the figure, the present invention in one or more embodiments also provides for communication between the bus and the upper I/O cells and at for communication between the bus and the upper I/O cells.

In accordance with an implementation of the present invention, connection bumps for communication as between components of the circuits may also be utilized. For instance bumps, solder bump, micro bumps, communication bump, connection balls, solder balls, flip-chip bumps and similar are intended to be used interchangeably herein. The bumps are intended to include any of the above and provide both some structural alignment of devices and components as well as provide communications between adjacent components. The bumps, for the present invention in one or more embodiments provide connectivity as between the I/O cells and the PHY logic in combination with structural benefits due to the bump geometry.

Additionally, in further implementations of the present invention, a routing channel across the PHY logic may also be provided such that the present invention may further provide the ability to have communication between non-adjacent components having logic proximate to one, for instance. By providing at least one routing channel in one or more embodiments of the present invention, in one or more locations, a reduction in the length of communication connections is obtained as the channel effectively enables a shorter connection between the logic and each I/O row in accordance with the arrangement of the present invention.

It is envisioned that further embodiments of the present invention may have multiple dual row I/O's with embedded logic in communication such that the devices developed using the present invention may be taller than described above, due to the additional stacking. Accordingly, further interconnects and logic arrangements would also be adapted within the scope of the present invention to provide for satisfactory operation of such taller arrangements.

For the avoidance of doubt, the use of connections bumps and/or routing channels in the present invention is preferable in one or more embodiments but is not necessarily required for implementation or operation of the invention. Similarly, depiction of circuitry and interconnects, for instance but not by way of limitation, in the figures may be readily adapted to account for technological improvements in the art as well as other preferred methods or approaches without deviating from the spirit, intent and claims of the invention.

In an embodiment, the present invention may incorporate or integrate the encapsulation, machining, and silicon die making processes associated with other IC manufacturing and creation. The present invention is not intended to be limited to a particular IC manufacturing process but may be adapted to or adapted with another process as well.

In a further embodiment, the present invention provides for including a plurality of dual I/O having an upper row of I/O and a lower row of I/O, with PHY logic arranged in communication between the upper and the lower rows of the dual row I/O, including one or more of solder bumps, encapsulation steps, wafer creation, silicon inclusion, silicon carbide (SiC) fabrication techniques, etching, and chip scale packaging (CSP).

Advantageously, the present invention also provides for the reallocation of valuable footprint space where additional electronics and circuitry may be deployed as the logic of traditional designs, along with its associated footprint, is embedded within the dual row I/O of the present invention thereby creating additional footprint space for further performance and other beneficial gain.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the present invention.

What is claimed is:

1. An integrated circuit comprising:
a substrate having circuitry including a bus;
a core logic arranged for communication with the circuitry;
a dual row I/O comprising a first plurality of I/O cells and a second plurality of I/O cells arranged in general alignment in relation to one another;
a physical layer (PHY) logic arranged for communication with the dual row I/O and situated between the first plurality of I/O cells and the second plurality of I/O cells; and
a first set of communication interconnects arranged between the first plurality of I/O cells and the PHY logic and a second set of communication interconnects arranged between the second plurality of I/O cells and the PHY logic, wherein each of the first set and the second set of communication interconnects are the same length.

2. The circuit of claim 1, wherein the first set and the second set of communication interconnects comprises a plurality of PHY logic interconnects that are each between each I/O cell of the first plurality and the second plurality of I/O cells and an associated PHY logic.

3. The circuit of claim 2, wherein each PHY logic interconnect is generally similar in length and generally uniform in footprint.

4. The circuit of claim 3, further comprising one or more routing channels in the core logic for providing communication through the PHY logic to one or more of the first plurality of I/O cells and the second plurality of I/O cells.

5. The circuit of claim 3, further comprising a plurality of solder bumps for situating the PHY logic arranged for communication with the dual row I/O, wherein each bump of the plurality of solder bumps is an internal interconnect providing for communication and structural integrity.

6. The circuit of claim 5, wherein each solder bump is a conductive bump for connecting the dual row I/O externally.

7. The circuit of claim 1, further comprising a first plurality of bus interconnects between the bus and each I/O cell of the first plurality of I/O cells.

8. The circuit of claim 1, further comprising a second plurality of bus interconnects between the bus and each I/O cell of the second plurality of I/O cells.

9. An integrated circuit comprising:
a substrate having circuitry including a bus;
a plurality of electronic components including core logic arranged for communication with the circuitry;
a dual row I/O comprising an upper plurality of I/O cells stacked on top of a lower plurality of I/O cells, wherein the upper and lower plurality of I/O cells are arranged in general alignment in relation to one or more physical edges;

a physical layer (PHY) logic arranged for communication with the dual row I/O and situated between the upper plurality of I/O cells and the lower plurality of I/O cells; and a plurality of interconnects including a plurality of PHY logic pathways that each have a substantially similar predetermined length and are each arranged between an associated PHY logic for each I/O cell of the upper and lower plurality of I/O cells and including a plurality of bus pathways that each have a substantially similar predetermined length and are each arranged between the associated PHY logic for each I/O cell of the upper and lower plurality of I/O cells.

* * * * *